(12) United States Patent
Charles

(10) Patent No.: US 7,289,545 B2
(45) Date of Patent: Oct. 30, 2007

(54) SEMICONDUCTOR LASER WITH INTEGRATED HEATING ELEMENT AND METHOD OF MANUFACTURING SAME

(75) Inventor: Paul Marshall Charles, Ipswich (GB)

(73) Assignee: Avago Technologies Fiber IP (Singapore) Pte Ltd, Singapore (SG)

( * ) Notice: Subject to any disclaimer, the term of this patent is extended or adjusted under 35 U.S.C. 154(b) by 503 days.

(21) Appl. No.: 10/995,511

(22) Filed: Nov. 24, 2004

(65) Prior Publication Data

US 2006/0039427 A1  Feb. 23, 2006

(30) Foreign Application Priority Data

Dec. 4, 2003 (GB) .................................. 0328082.3

(51) Int. Cl.
*H01S 3/04* (2006.01)
*H01S 5/00* (2006.01)

(52) U.S. Cl. ..................... 372/34; 372/43.01; 372/50.1

(58) Field of Classification Search ................... 372/34
See application file for complete search history.

(56) References Cited

U.S. PATENT DOCUMENTS

| 4,965,806 A | 10/1990 | Asby |
| 2002/0090011 A1 | 7/2002 | Pezeshki |

FOREIGN PATENT DOCUMENTS

| DE | 19177545 | 9/1998 |
| EP | 0578883 | 1/1994 |
| JP | 10225187 | 9/1989 |

*Primary Examiner*—Armando Rodriguez

(57) ABSTRACT

A semiconductor laser structure has a laser active region and side trenches extending along the laser active region. At least one heatable stripe, in at least one of the side trenches, is connected to an electric power source. The amount of energy the source supplies to the stripe controls the laser active region temperature to control and offset effects of active region temperature on the emitted wavelength.

26 Claims, 2 Drawing Sheets

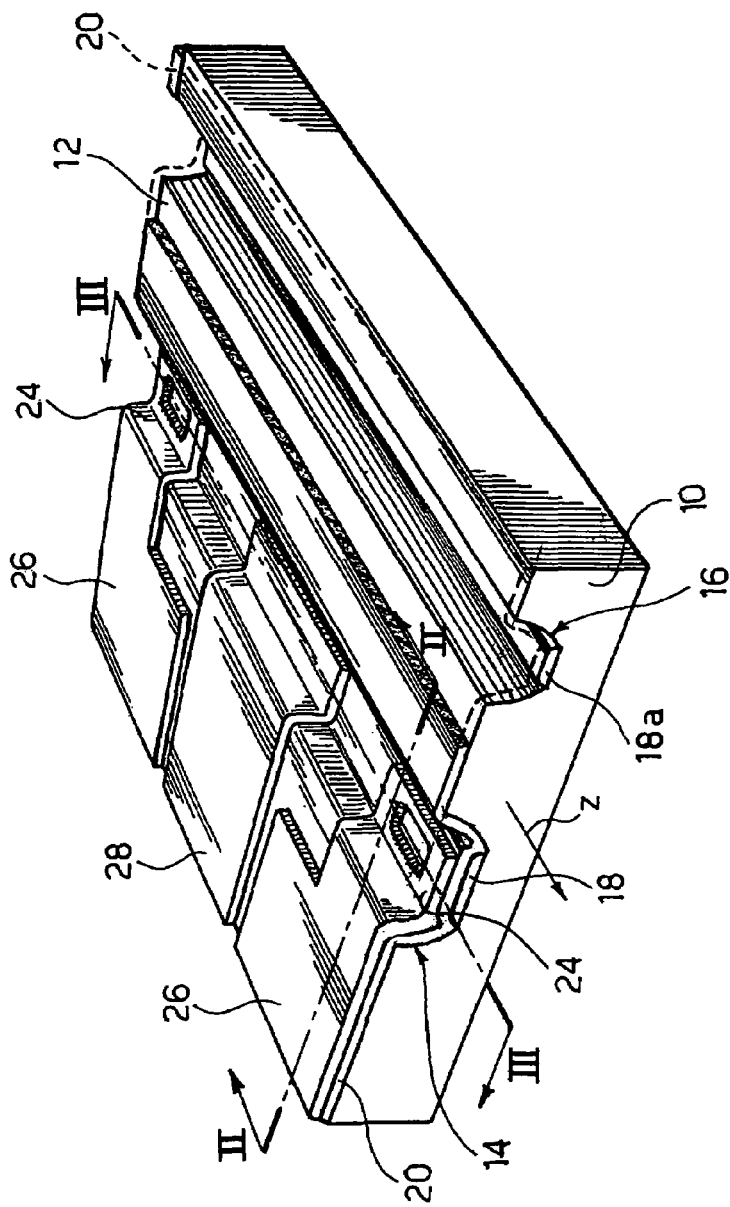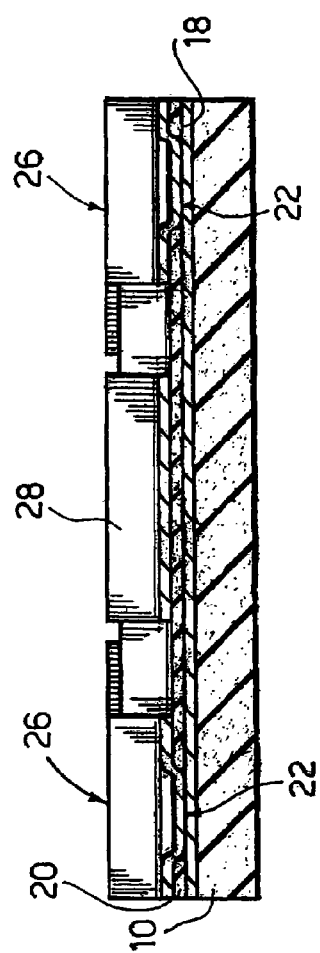

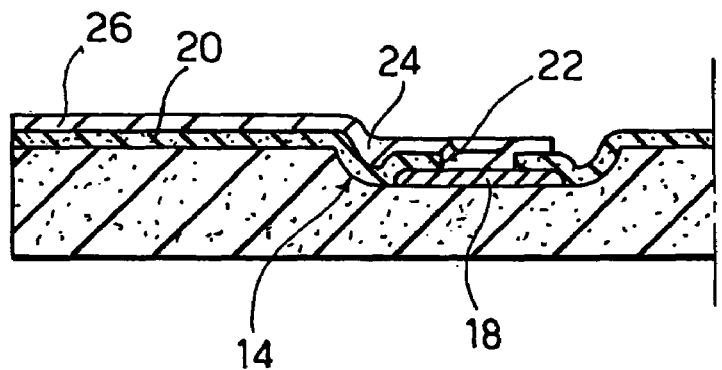
Fig_2
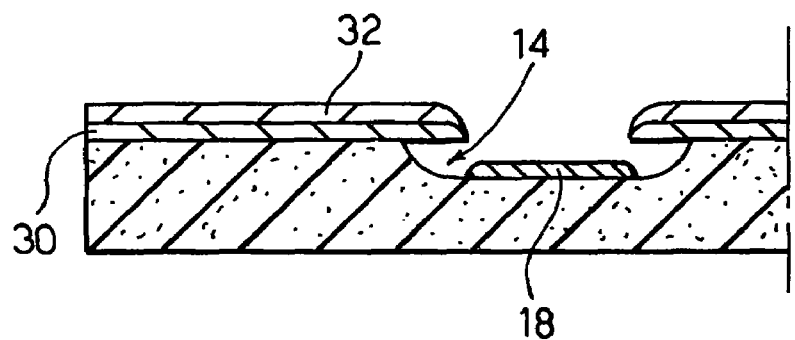
Fig_4
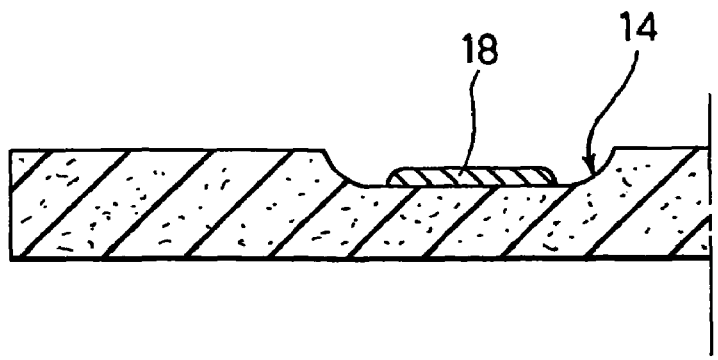
Fig_5

SEMICONDUCTOR LASER WITH INTEGRATED HEATING ELEMENT AND METHOD OF MANUFACTURING SAME

FIELD OF INVENTION

The present invention relates to semiconductor lasers and more particularly to a semiconductor layer with laser material that can be heated controllably.

BACKGROUND OF INVENTION

Lasers for "Coarse Wavelength Division Multiplexing" (CWDM) applications are expected to operate over a wide temperature range (typically −10 to +85° C.). Changes in bandgap with temperature change the lasing wavelength at approximately 0.1 nm/° C. Each CWDM channel is typically 20 nm wide. This is reduced to approximately 13 nm by filtering; allowing for the operating temperature range and wavelength change over time, a further reduction to approximately 3.5 nm is achieved. Typically, a spread in lasing wavelength of 4-5 nm is seen over a wafer carrying a plurality of such lasers.

The variation in wavelength across the wafer is wider than the specification width, which produces a substantial yield hit (i.e. yield is made appreciably lower). The ability to control or tune the wavelength to offset the effects of temperature will thus significantly improve the yield and thus reduce the laser chip cost.

Integrating heater elements with laser diodes is generally known in the art as witnessed e.g. by U.S. Pat. Nos. 5,173,909 and 5,960,014.

Specifically, U.S. Pat. No. 5,173,909 discloses a wavelength tunable laser diode comprising a temperature variable heater separated from an active layer by a distance less than the thickness of a compound semiconductor substrate. The heater is thus located very close to the active layer, thereby improving the response time of temperature change. This is reported to widen the tunable range of the laser diode.

Any other remarks apart, the arrangement disclosed in U.S. Pat. No. 5,173,909 has the heater element located directly above the active layer of the laser and may therefore be difficult to manufacture.

The arrangement described in U.S. Pat. No. 5,960,014 includes a thin film resistor comprising a bilayer of platinum on titanium. The resistor layer is protected by a layer of dielectric, e.g. silicon dioxide or silicon nitride to reduce degradation from humidity and under high temperature operation. The resistor may be formed on various substrates, including silicon dioxide, silicon nitride and semiconductor substrates. The applications contemplated include integrated resistive heaters for wavelength fine tuning of a semiconductor laser array.

In the arrangement of U.S. Pat. No. 5,960,014, the heating element is positioned on the chip surface at a relatively remote location from the active region. As a consequence, poor heat transfer limits sensitivity and response time.

An object of the present invention is to provide an improved arrangement which may provide a heater element located in the close vicinity of the laser active region, such a result being achieved without making the manufacturing process unnecessarily complex, expensive and possibly less reliable.

SUMMARY OF INVENTION

In a preferred embodiment of the invention, a heater element is located in an etched trench extending at the side of the laser active region. This allows for good thermal coupling between the heater element and the laser active region thereby improving response time and sensitivity. This result is preferably achieved while maintaining compatibility with a current Buried Heterostructure (BH) Distributed FeedBack (DFB) laser fabrication process.

In a preferred embodiment of the invention, the heater element is a heater stripe and full sized heater contact bond pads are associated with the heater stripe, thereby simplifying the assembly process. Such an approach also enables twin heater elements to be placed on either side of the laser active region for improved performance.

BRIEF DESCRIPTION OF THE DRAWING

The invention will now be described, by way of example only, with reference to the annexed figures of drawing, wherein:

FIG. 1 is a general perspective view of a semiconductor laser arrangement according to the invention, FIG. 2 is a cross-sectional view taken along line II-II of FIG. 1, FIG. 3 is another sectional view taken along line III-III of FIG. 1, and FIGS. 4 and 5 are schematic views exemplary of steps in a process of manufacturing the arrangement of the previous figures.

DETAILED DESCRIPTION OF THE DRAWING

FIG. 1 is a general perspective view of a semiconductor (e.g. silicon) substrate 10 onto which a semiconductor laser active region 12 is produced according to a current Buried Heterostructure (BH) Distributed FeedBack (DFB) laser fabrication process.

The details of such a fabrication process are well known to those of skill in the art, thus making it unnecessary to provide a detailed description herein.

For the purposes of this description, it will suffice to recall that the laser active region 12 is essentially in the form of an elongated mesa-like structure extending along a main axis z that also identifies the lasing direction.

As a result of the fabrication process, the laser active region 12 extends between two trenches 14, 16 formed in the surface of the semiconductor substrate 10. More specifically, the active laser region 12 is located between two trenches 14, 16 and is approximately 1.5 micrometer in width. The space between trenches 14, 16, currently referred to as trench separation, is approximately 10 micrometers in the current design.

In typical BH DFB fabrication processes, the two trenches 14 and 16 have identical cross-sectional dimensions.

In the embodiment shown, trench 14 is produced (as better detailed in the following) in such a way as to be generally wider than trench 16. It is to be understood that both trenches 14 and 16 can have identical cross-sectional dimensions, with the trench 16 being of identical cross dimensions with respect to the trench 14.

Deposited at the bottom surface of the trench 14 is a heater stripe 18 adapted to be heated as a result of being fed with electric power from a suitable source, e.g., a DC source, (not shown). Opposite electrodes of the power source are connected to opposite ends of stripes 18.

While the stripe 18 is preferably comprised of Ti/Pt alloy, most metals can be used as an alternative material for the heater stripe 18. Likely practical materials are tungsten (W), aluminium (Al), silver (Ag) or gold (Au). Most other semiconductor substrate materials can be heated by the same method, such as e.g. silicon, gallium arsenide, gallium nitride, cadmium telluride. Mentioning these materials includes possible mixtures/alloys thereof.

Preferably, the heater stripe 18 is deposited by means of E-beam technology, which (for reasons to be better understood in the following) usually produces a substantially similar stripe 18a at the bottom of the trench 16.

A $SiO_2$ passivation layer 20 is deposited (again by standard deposition processes well known in the art for that purpose) over the whole structure described in the foregoing.

Holes 22 are then formed in the passivation layer 20 at the ends of the heater stripe 18 and pad/stripe connections 24 (typically comprised of TiAu alloy) are then formed to provide external contacts for the end portions of the heater stripe 18 via full sized heater contact bond pads 26. The opposite electrodes of the power source for energizing stripe 18 to a desired temperature are connected to contact pads 26.

A TiAu alloy is a preferred choice for the pad/stripe connections 24. Suitable alternatives are again represented by any other material as listed previously in connection with the heater stripe 18.

A substantially similar connection 28 is provided at a position intermediate contact pads 26 in order to provide the p-contact for the laser active region 12.

As indicated, the trench 14 is preferably enlarged with respect to a standard BH DFB process in order to allow for the width of the heater stripe/element 18. A way to achieve this is to define the heater element 18 by E-beam lift-off of Ti/Pt self-aligned to trenches 16 and 16.

Specifically, the cross-sectional view of FIG. 4 includes an illustration of an intermediate stage of fabrication with a trench etch resist mask 30 still in place and covered by an evaporated Ti/Pt layer 32.

This is the same type of layer deposited at the bottom or base of the trench 14 to form the heater stripe 18.

FIG. 4 shows that the initial etch mask area is generally increased in comparison with a standard process in order to permit formation of undercut regions 34 under the mask edges, resulting in a wider trench in comparison with the standard BH DFB fabrication process. For instance, if a 25 micrometer wide stripe is required, then a 25 micrometer mask width is used.

Such an approach is generally preferred to increasing the etch time: increasing the etch time increases the trench depth while increasing the undercut and could cause problems due to increased non-planarity of the semiconductor wafer surface.

FIG. 5 is representative of the same arrangement shown in FIG. 4 after lift-off, while the cross-sectional view of FIG. 2 is representative of the detail of a heater pad/stripe connection 24 upon completion of the fabrication process with the formation of the passivation layer 20 and the heater pad/stripe connections 24 extending into the holes 22.

A conventional etch process can be used in place of the E-beam lift-off process briefly described in the foregoing. In either case, contact window oxide 20 encapsulates and passivates the heater stripe 18, which may be significant for stability.

Those of ordinary skill in the art will appreciate that the fabrication process just described is similar to a standard BH DFB laser fabrication process but for two exceptions, namely:

(1) formation of additional contact holes 22 in the oxide layer 20 to provide access to the heater stripe 18, and (2) formation of the additional contact pads 26 for the heater stripe/element adjacent to the main laser contact pad 28.

As indicated, formation of the heater stripe 18 at the bottom surface of the trench 14 within the framework of an otherwise standard BH DFB fabrication process results in the deposition of an essentially similar stripe 18a at the bottom of the trench 16.

The same processing step previously illustrated in connection with trench 14 (including the steps leading to the formation of a "wider" trench) can be applied to trench 16 and stripe 18a formed therein. This processing step includes the possible formation of contact holes essentially similar to contact holes 22 in the oxide layer 20 at the opposite ends of the stripe 18a and the provision of a heater pad/stripe connections for the stripe 18a essentially similar to those previously described with reference to the heater stripe 18.

Specifically, the connection 24 (TiAu alloy or the like) contacting the ends of the stripe 18 through the holes 22 can be extended over the laser active region 12 to contact the stripe 18a, whereby both stripes 18 and 18a can be supplied and thus heated via the heater contact pads 26, thus making it unnecessary to provide separate contact pads for the two stripes.

The availability of twin heater elements (i.e., stripes 18 and 18a) located on both sides of the laser active region 12 may result in a more uniform heat distribution and improved performance while also possibly reducing the cross-sectional areas of both trenches 14 and 16.

Consequently, without prejudice to the underlying principle of the invention, the details and embodiments may vary, also significantly, with respect to what has been described in the foregoing, by way of example only, without departing from the scope of the invention as defined by the claims that follow.

The invention claimed is:

1. An arrangement including:
   a semiconductor laser structure including a laser active region having at least one side trench extending along said laser active region, and
   a heatable element arranged in said at least one side trench so as to be in heat transfer relation with the laser active region, the heatable element being adapted to be powered by an energy source for heating the heatable element and for causing the laser active region to be at a desired temperature.

2. The arrangement of claim 1 wherein the heatable element comprises a heatable stripe.

3. The arrangement of claim 2, wherein laser active region extends between two side trenches, the heatable stripe being arranged in each of said side trenches.

4. The arrangement of claim 1, wherein said heatable stripe is arranged at the bottom of said at least one side trench.

5. The arrangement of claim 4, wherein said heatable stripe is a deposited strip in said at least one side trench.

6. The arrangement of claim 5, further including a passivation layer extending over said heatable stripe, and contact holes through said passivation layer at opposed ends of said heatable stripe.

7. The arrangement of claim 1, further including heater contact pads in electric contact with opposite ends of said heatable element.

8. The arrangement of claim 6, wherein at least a portion of said heater contact pads extend into said contact holes, the portion of the heater contact pads extending into the holes being in electrical contact with said heatable stripe.

9. The arrangement of claim 8, wherein said heatable stripe includes electrically heatable material.

10. The arrangement of claim 9, wherein said heatable stripe is comprised of a material selected from the group consisting of metals and semiconductor substrate materials.

11. The arrangement of claim 10, wherein said heatable stripe includes a material selected from the group consisting of essentially Ti/Pt, tungsten, aluminium, silver and gold.

12. The arrangement of claim 10, wherein said heatable stripe includes a material selected from the group consisting of essentially silicon, gallium arsenide, gallium nitride, and cadmium telluride.

13. The arrangement of claim 9, wherein said heatable stripe is essentially a Ti/Pt stripe.

14. The arrangement of claim 7, wherein said heater contact pads are essentially TiAu contact pads.

15. A process of manufacturing an arrangement according to claim 14, comprising the step of etching said at least one side trench by using an etch resist mask, and forming said at least one side trench by forming underetch regions under said resist mask.

16. The method of claim 15, further including the step of defining said heatable element by a process selected from the group consisting of E-beam lift-off and an etch process.

17. The arrangement of claim 2, wherein said heatable stripe is arranged at the bottom of said at least one side trench.

18. The arrangement of claim 2, wherein said heatable stripe is a deposited strip in said at least one side trench.

19. The arrangement of claim 2, further including a passivation layer extending over said heatable stripe, and contact holes being provided through said passivation layer at opposed ends of said heatable stripe.

20. The arrangement of claim 7, wherein at least a portion of said heater contact pads extend into said contact holes, the portion of the heater contact pads extending into the holes being in electrical contact with said heatable stripe.

21. The arrangement of claim 2, wherein said heatable stripe includes electrically heatable material.

22. The arrangement of claim 2, wherein said heatable stripe is comprised of a material selected from the group consisting of metals and semiconductor substrate materials.

23. A process of manufacturing an arrangement according to claim 2, comprising the step of etching said at least one side trench by using an etch resist mask, and forming said at least one side trench by forming underetch regions under said resist mask.

24. The method of claim 23, further including the step of defining said heatable stripe by a process selected from the group consisting of E-beam lift-off and an etch process.

25. The arrangement of claim 1 in combination with an energy source for supplying sufficient energy to the heatable element to heat the laser active region to the desired temperature.

26. The arrangement of claim 25 wherein the heatable element comprises a stripe.

\* \* \* \* \*